United States Patent
Herbsommer et al.

(10) Patent No.: US 10,549,986 B2
(45) Date of Patent: Feb. 4, 2020

(54) HERMETICALLY SEALED MOLECULAR SPECTROSCOPY CELL

(71) Applicant: TEXAS INSTRUMENTS INCORPORATED, Dallas, TX (US)

(72) Inventors: Juan Alejandro Herbsommer, Allen, TX (US); Simon Joshua Jacobs, Lucas, TX (US); Benjamin Stassen Cook, Addison, TX (US); Adam Joseph Fruehling, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/697,525

(22) Filed: Sep. 7, 2017

(65) Prior Publication Data
US 2019/0071306 A1 Mar. 7, 2019

(51) Int. Cl.
*B81C 1/00* (2006.01)
*H01L 23/08* (2006.01)
*H01L 21/768* (2006.01)

(52) U.S. Cl.
CPC ...... *B81C 1/00047* (2013.01); *B81C 1/00539* (2013.01); *H01L 21/76898* (2013.01); *H01L 23/08* (2013.01); *B81B 2203/0315* (2013.01)

(58) Field of Classification Search
CPC .............................................. B81C 1/00047
USPC ...................................................... 331/94.1
See application file for complete search history.

(56) References Cited

U.S. PATENT DOCUMENTS

| | | |
|---|---|---|
| 4,147,431 A | 4/1979 | Mann |
| 4,826,616 A | 5/1989 | Tanino |
| 5,107,231 A | 4/1992 | Knox |
| 5,198,786 A | 3/1993 | Russell et al. |
| 5,218,373 A | 6/1993 | Heckaman et al. |
| 5,412,186 A | 5/1995 | Gale |
| 5,459,324 A | 10/1995 | Fima |
| 5,821,836 A | 10/1998 | Katehi et al. |
| 6,131,256 A | 10/2000 | Dydyk et al. |

(Continued)

FOREIGN PATENT DOCUMENTS

| | | |
|---|---|---|
| JP | 6428974 | 1/1989 |
| WO | 2014037016 | 3/2014 |
| WO | 2016161215 | 10/2016 |

OTHER PUBLICATIONS

International Search Report for PCT/US2018/049513 dated Nov. 15, 2018.

(Continued)

*Primary Examiner* — Joseph Chang

(74) *Attorney, Agent, or Firm* — Michael A. Davis, Jr.; Charles A. Brill; Frank D. Cimino

(57) ABSTRACT

An illustrate method (and device) includes etching a cavity in a first substrate (e.g., a semiconductor wafer), forming a first metal layer on a first surface of the first substrate and in the cavity, and forming a second metal layer on a non-conductive structure (e.g., glass). The method also may include removing a portion of the second metal layer to form an iris to expose a portion of the non-conductive structure, forming a bond between the first metal layer and the second metal layer to thereby attach the non-conductive structure to the first substrate, sealing an interface between the non-conductive structure and the first substrate, and patterning an antenna on a surface of the non-conductive structure.

11 Claims, 6 Drawing Sheets

(56) References Cited

U.S. PATENT DOCUMENTS

| | | |
|---|---|---|
| 6,236,366 B1 | 5/2001 | Yamamoto et al. |
| 6,362,706 B1 | 3/2002 | Song et al. |
| 6,498,550 B1 | 12/2002 | Miller et al. |
| 6,630,359 B1 | 10/2003 | Caillat et al. |
| 6,670,866 B2 | 12/2003 | Ella et al. |
| 6,842,088 B2 | 1/2005 | Yamada et al. |
| 6,989,723 B2 | 1/2006 | Komuro et al. |
| 6,998,691 B2 | 2/2006 | Baugh |
| 7,388,454 B2 | 6/2008 | Ruby et al. |
| 7,408,428 B2 | 8/2008 | Larson, III |
| 8,098,208 B2 | 1/2012 | Ficker et al. |
| 8,268,642 B2 | 9/2012 | Yoshitomi et al. |
| 8,293,661 B2 | 10/2012 | Yamazaki |
| 8,586,178 B2 | 11/2013 | Schwanke et al. |
| 9,436,902 B1 | 9/2016 | Koepp et al. |
| 9,529,334 B2 | 12/2016 | Herbsommer et al. |
| 9,735,754 B2 | 8/2017 | Shin et al. |
| 2002/0038989 A1 | 4/2002 | Larson, III |
| 2002/0068018 A1 | 6/2002 | Pepper et al. |
| 2002/0098611 A1 | 7/2002 | Chang et al. |
| 2003/0015707 A1 | 1/2003 | Bosco et al. |
| 2003/0048500 A1* | 3/2003 | Fala ............... H03L 7/085 398/5 |
| 2003/0107459 A1 | 6/2003 | Takahashi et al. |
| 2004/0142484 A1 | 7/2004 | Berlin et al. |
| 2004/0166577 A1 | 8/2004 | Storek et al. |
| 2005/0023932 A1 | 2/2005 | Inoue et al. |
| 2006/0022761 A1 | 2/2006 | Abeles |
| 2006/0076632 A1 | 4/2006 | Palmateer et al. |
| 2006/0144150 A1 | 7/2006 | Wu |
| 2007/0189359 A1 | 8/2007 | Chen et al. |
| 2008/0319285 A1 | 12/2008 | Hancock |
| 2010/0182102 A1 | 7/2010 | Kuypers et al. |
| 2010/0259334 A1 | 10/2010 | Briggs |
| 2010/0327701 A1 | 12/2010 | Grannen et al. |
| 2011/0140971 A1 | 6/2011 | Schwanke et al. |
| 2012/0266681 A1 | 10/2012 | Baumann et al. |
| 2013/0176703 A1 | 7/2013 | Hopper et al. |
| 2014/0155295 A1 | 6/2014 | Hindson et al. |
| 2014/0210835 A1 | 7/2014 | Hong et al. |
| 2014/0347074 A1 | 11/2014 | Nadeau |
| 2014/0368376 A1 | 12/2014 | Nadeau et al. |
| 2014/0368377 A1 | 12/2014 | Nadeau et al. |
| 2014/0373599 A1 | 12/2014 | Trombley et al. |
| 2015/0144297 A1 | 5/2015 | Toivonen et al. |
| 2015/0123748 A1 | 7/2015 | Stevenson |
| 2015/0277386 A1* | 10/2015 | Passilly ............... G04F 5/145 331/94.1 |
| 2016/0091663 A1 | 3/2016 | Taylor |
| 2016/0233178 A1 | 8/2016 | Lamy et al. |
| 2017/0073223 A1 | 3/2017 | Nasiri et al. |
| 2017/0125660 A1 | 5/2017 | Stephanou et al. |
| 2017/0130102 A1 | 5/2017 | Campbell et al. |
| 2018/0159547 A1 | 6/2018 | Herbsommer et al. |

OTHER PUBLICATIONS

International Search report for PCT/US 2018/049940 dated Dec. 13, 2018.
International Search report for PCT/US 2018/049949 dated Dec. 13, 2018.
International Search Report for PCT/US2018/049949 dated Dec. 27, 2018.
International Search Report for PCT/US2018/047105 dated Dec. 27, 2018.
International Search Report for PCT/US2018/050253 dated Jan. 10, 2019.
Alvarez, A.L. et al; "The Application of Microencapsulation Techniques in the Treatment of Endodontic and Periodontal Diseases" Pharmaceutics; 2011 abstract pp. 540-548.
Steinberg, D. et al; "A New Degradable Controlled Release Device for Treatment of Periodontal Disease: In Vitro Release Study"; J. Periodontology; 1990; p. 393 lines 1-17; p. 394 col. 1 lines 5-14.
Kiong, R. et al.; "Towards Theranostic Multicompartment Microcapsules: in situ Diagnostics and Laser-induced Treatment", Theranostics; 2013; pp. 145-149.

* cited by examiner

HERMETICALLY SEALED MOLECULAR SPECTROSCOPY CELL

BACKGROUND

Various applications may include a sealed chamber formed in a semiconductor structure. In one particular application, a chip-scale atomic clock may include a selected vapor at a low pressure in a sealed chamber. Forming such structures can be a challenge.

SUMMARY

In one embodiment, a method includes etching a cavity in a first substrate (e.g., a semiconductor wafer), forming a first metal layer on a first surface of the first substrate and in the cavity, and forming a second metal layer on a non-conductive structure (e.g., glass). The method also may include removing a portion of the second metal layer to form an iris to expose a portion of the non-conductive structure, forming a bond between the first metal layer and the second metal layer to thereby attach the non-conductive structure to the first substrate, sealing an interface between the non-conductive structure and the first substrate, and patterning an antenna on a surface of the non-conductive structure. The method also may include the deposition or bonding of further dielectric and metal layers and their subsequent patterning on the topmost surface to improve the radio frequency (RF) performance of antenna, transmission line structures, and electromagnetic bandgap structures.

In another embodiment, a device includes a first substrate attached to a non-conductive structure. The first substrate includes a cavity which is covered by the non-conductive structure. A first metal layer is provided on a surface of the first substrate and in the cavity. Further, a second metal layer is provided on a surface of non-conductive structure. The second metal layer includes an iris exposing the non-conductive structure; and. A first antenna is patterned on a surface of the non-conductive structure opposite the first substrate.

In yet another embodiment, a device includes a semiconductor substrate attached to a glass sheet. The semiconductor substrate includes a cavity which is covered by the glass sheet. A first metal layer is provided on a surface of the semiconductor substrate and in the cavity, and a second metal layer is provided on a surface of the glass sheet. The second metal layer includes an iris exposing a portion of the glass sheet. First and second antennas are patterned on a surface of the glass sheet opposite the semiconductor substrate. The device also may include a transceiver electrically coupled to the first and second antennas and configured to inject a transmit signal into the cavity through the first antenna, generate an error signal based on the transmit signal and a receive signal from the second antenna, and dynamically adjust a frequency of the transmit signal based on the error signal. The cavity may contain dipolar molecules and has an internal pressure of less than 0.15 mbars.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The disclosed embodiments of the present disclosure include techniques to fabricate a hermetically sealed cavity in a substrate. A structure containing a substrate with the cavity may be used in numerous applications. One illustrative use is as a millimeter wave chip scale atomic clock. The cavity may contain a plurality of dipolar molecules (e.g., water molecules) at a relatively low pressure. For some embodiments, the pressure may be approximately 0.1 mbarr for water molecules. If argon molecules were used, the pressure may be several atmospheres. The hermetically sealed cavity may contain selected dipolar molecules at a pressure chosen to optimize the amplitude of a signal absorption peak of the molecules detected at an output of the cavity. An electromagnetic signal may be injected through aperture into the cavity. Through closed-loop control, the frequency of the signal is dynamically adjusted to match the frequency corresponding to the absorption peak of the molecules in the cavity. The frequency produced by quantum rotation of the selected dipolar molecules may be unaffected by circuit aging and may not vary with temperature or other environmental factors.

While a variety of materials and manufacturing operations can be employed, one illustrative method may include etching a cavity in a first substrate (e.g., a semiconductor wafer), forming a first metal layer on a first surface of the first substrate and in the cavity, forming a second metal layer on a non-conductive structure (e.g., glass such as a glass sheet), removing a portion of the second metal layer to form an iris to expose a portion of the non-conductive structure, forming a bond between the first metal layer and the second metal layer to thereby attach the non-conductive structure to the first substrate, sealing an interface between the non-conductive structure and the first substrate, and patterning an antenna on a surface of the non-conductive structure.

Figure 1A:
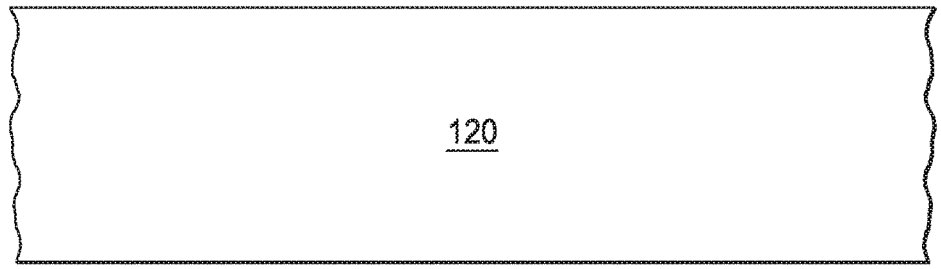
FIGS. 1A-1J illustrate a sequence of processing operations in one embodiment to form a hermetically sealed cavity.
Figure 1B:
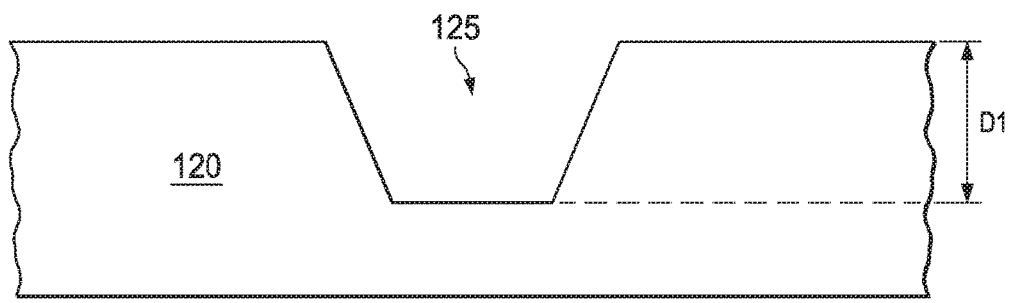
Figure 1C:
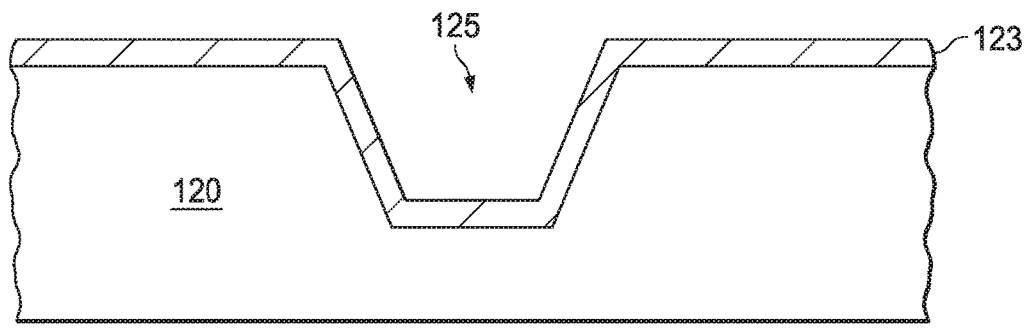

FIGS. 1A-1J illustrate a sequential set of process operations to construct a device with a hermetically sealed cavity. FIG. 1A illustrates a substrate 120. The substrate 120 may comprise a semiconductor substrate (e.g., silicon) in some embodiments, but can be other than a semiconductor substrate such as a ceramic in other embodiments. FIG. 1B illustrates that a cavity 125 has been formed in the substrate 120. The cavity 125 may be wet etched into the substrate 120 using a suitable wet etchant such as potassium hydroxide (KOH) or tetramethylammonium hydroxide (TMAH). The cavity has a depth D1 that is application-specific. FIG. 1C illustrates that a metal layer 123 has been deposited on a surface of the substrate 120 and into the cavity 125 as shown. The metal layer 123 may be sputter deposited (e.g., 40 nm TaN per micrometer of copper).

Figure 1D:
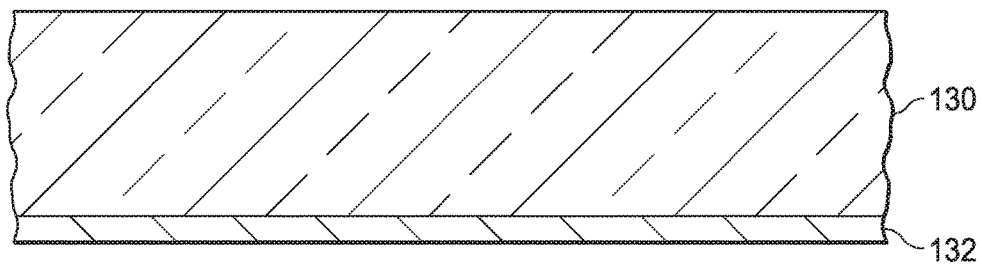

FIG. 1D illustrates a non-conductive structure 130. In one example, the non-conductive structure 130 comprises glass, but can include other types of materials such as ceramic or silicon in other embodiments. A metal layer 132 is shown formed to one surface of the non-conductive structure 130.

Figure 1E:
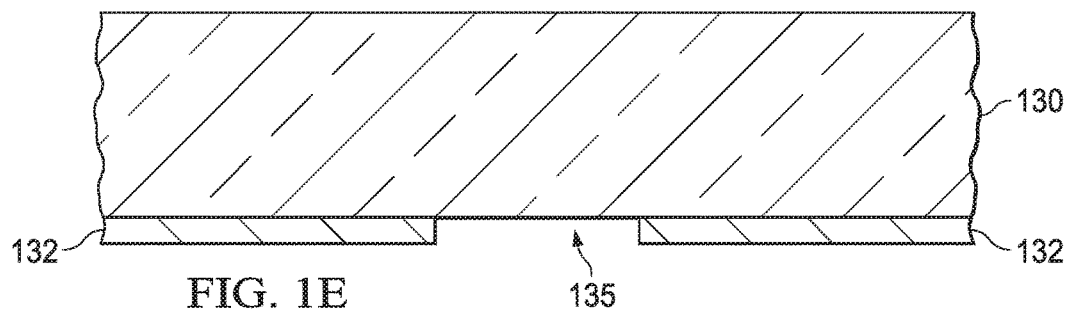

FIG. 1E illustrates that an iris 135 has been formed in the metal layer 132. The iris 135 may be formed by removing a portion of the metal layer 132, for example, by wet etching, dry etching, liftoff, etc.

Figure 1F:
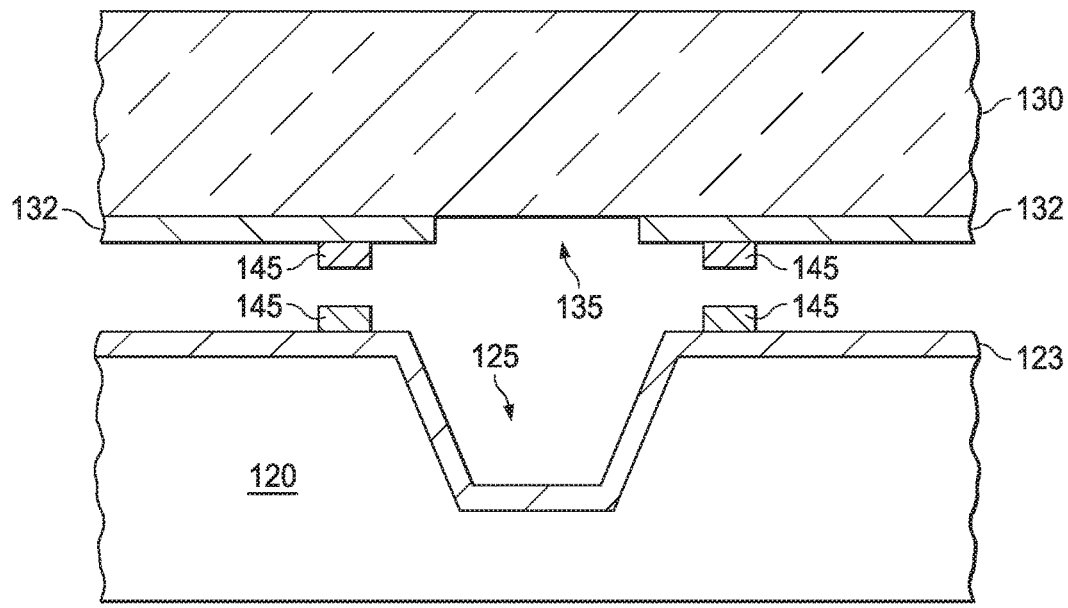
Figure 1G:
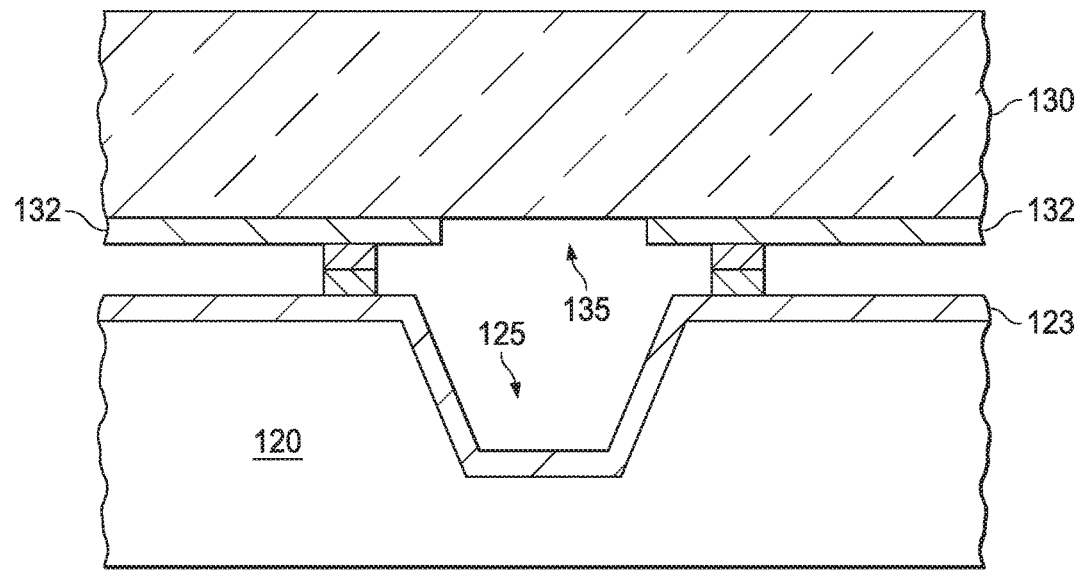
Figure 1H:
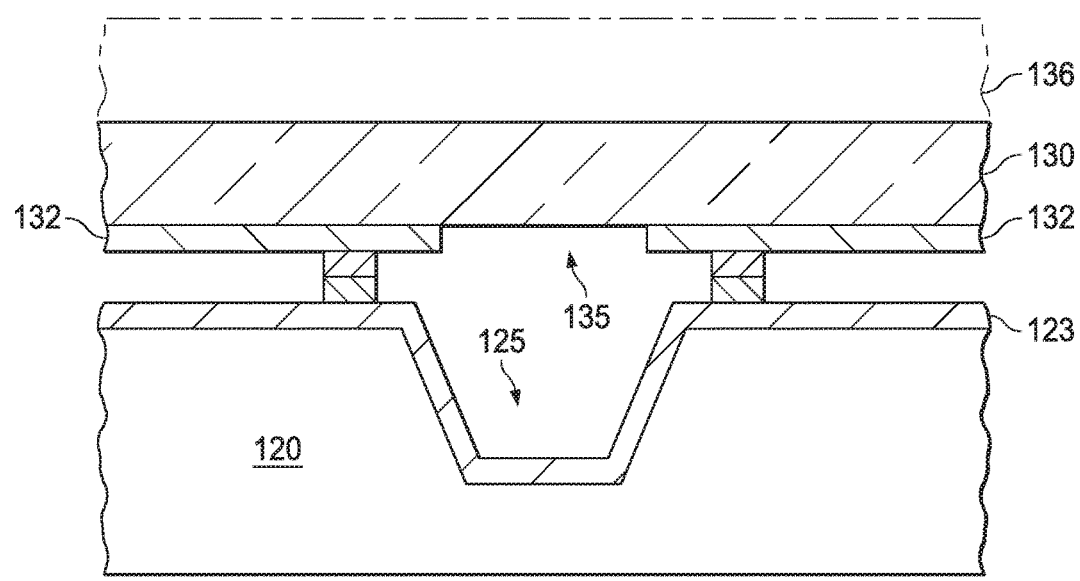

FIG. 1F illustrates that bonding structures 145 are deposited and patterned on either or both of the substrate 120 and non-conductive structure 130. In one example, the bonding structures comprise a gold, aluminum, silicon or other types of material that form a eutectic alloy when heated to a suitable temperature. FIG. 1G illustrates a device which includes the cavity 125. Dipolar molecules may be trapped inside the cavity 125. FIG. 1H illustrates that thickness of the non-conductive structure 130 is reduced. For example, an upper layer 136 may be removed. The upper layer 136 may be removed by, for example, a suitable etching process.

Figure 1I:
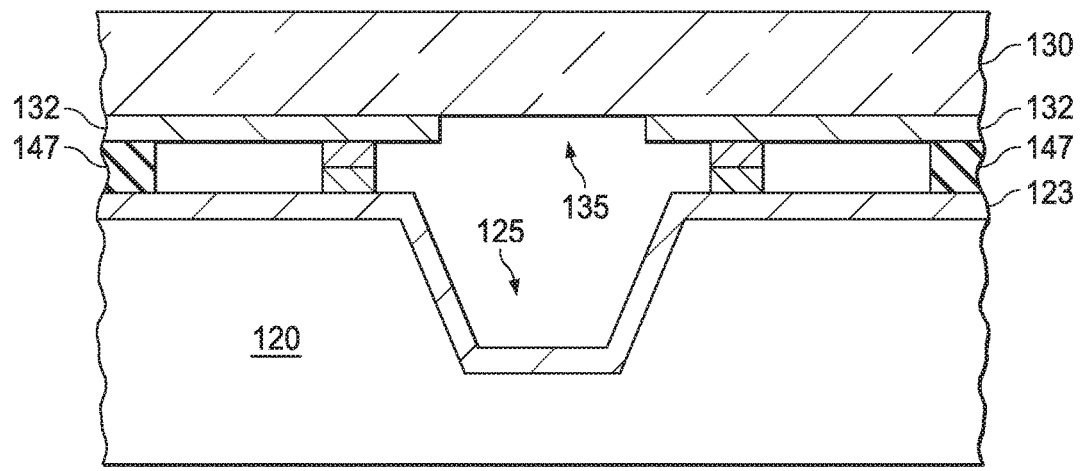

FIG. 1I illustrates that a seal 147 is included to seal the interface between the non-conductive structure 130 and the substrate 120 to thereby hermetically seal the cavity 125. The hermetically sealed cavity 125 may contain dipolar molecules (e.g., water molecules) at an internal pressure of less than 0.15 mbars (e.g., 0.1 mbars).

Figure 1J:
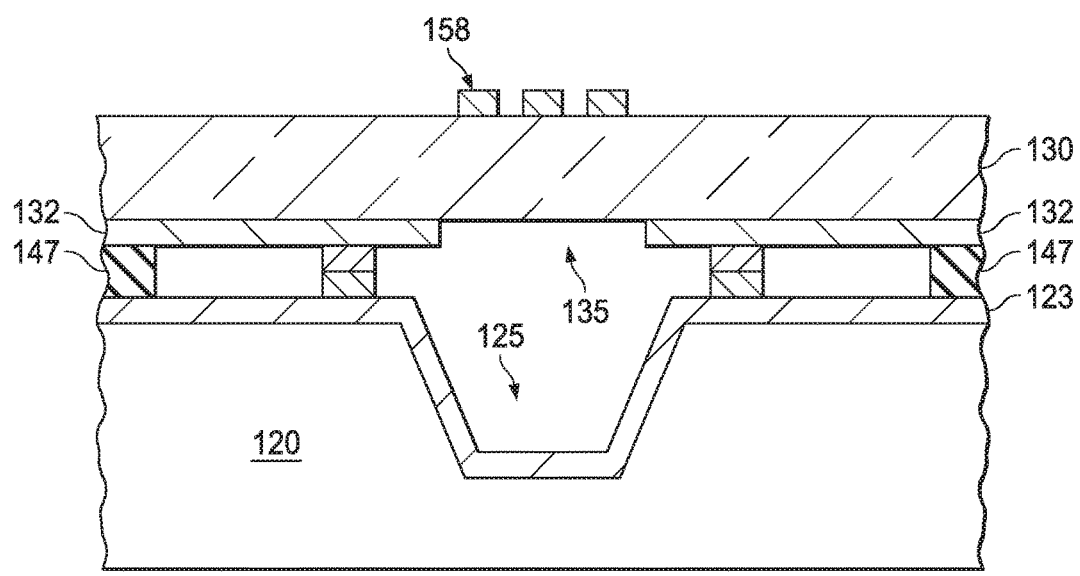

An antenna 158 is shown in FIG. 1J patterned on a surface of the non-conductive structure 130. The antenna 158 comprises a conductive material such as copper or gold and an electrical signal can be provided to the antenna or received from the antenna. In some embodiments, one antenna is used to both transmit and receive signals. In other embodiments, a pair of antennas is patterned on the non-conductive structure 108, and one antenna is used to inject a signal into the cavity and another antenna is used to receive a signal from the cavity. In such examples, the antennas may be located at or near opposite ends of the cavity.

Figure 2:
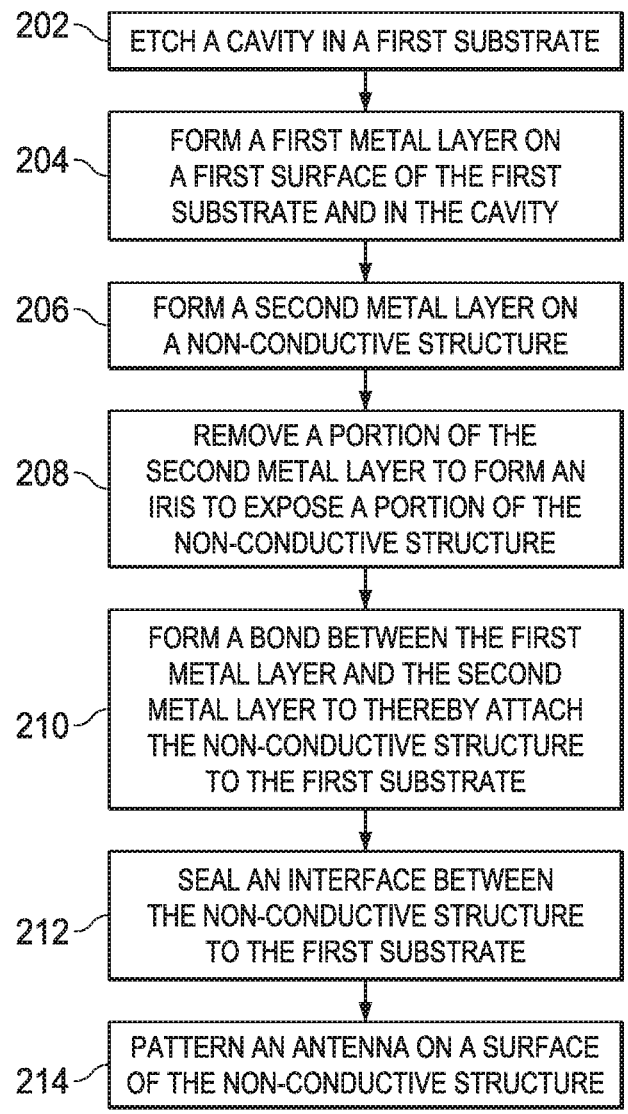
FIG. 2 illustrates a method flow chart to form a hermetically sealed cavity in accordance with various embodiments.

FIG. 2 illustrates a flow chart depicted a method in accordance with an example. The operations may be performed in the order shown, or in a different order. Further, the operations may be performed sequentially, or two or more of the operations may be performed concurrently.

At 202, the method includes etching a cavity in a first substrate (e.g., a semiconductor wafer or other suitable material). The etching process may comprise a wet etching process as explained above. At 204, the method includes forming a first metal layer (e.g., copper) on a first surface of the first substrate and in the cavity. At 206, the method further includes forming a second metal layer on a non-conductive structure (e.g., glass) and, at 208, the method includes removing a portion of the second metal layer to form an iris (e.g., iris 135) to expose a portion of the non-conductive structure. At 210, the method also includes forming a bond between the first metal layer and the second metal layer to thereby attach the non-conductive structure to the first substrate. The interface between the non-conductive structure and the first substrate is then sealed at 212, and an antenna is patterned on a surface of the non-conductive structure at 214.

An electronic bandgap structure also may be formed on the non-conductive structure 130. In operation, an electronic bandgap structure may help to attenuate electromagnetic waves along the outer surface of the non-conductive structure 130 between the antennas. The electronic bandgap structure helps to force the energy from the input signal received through an antenna (e.g., antenna 158) into the cavity 125.

Figure 3:
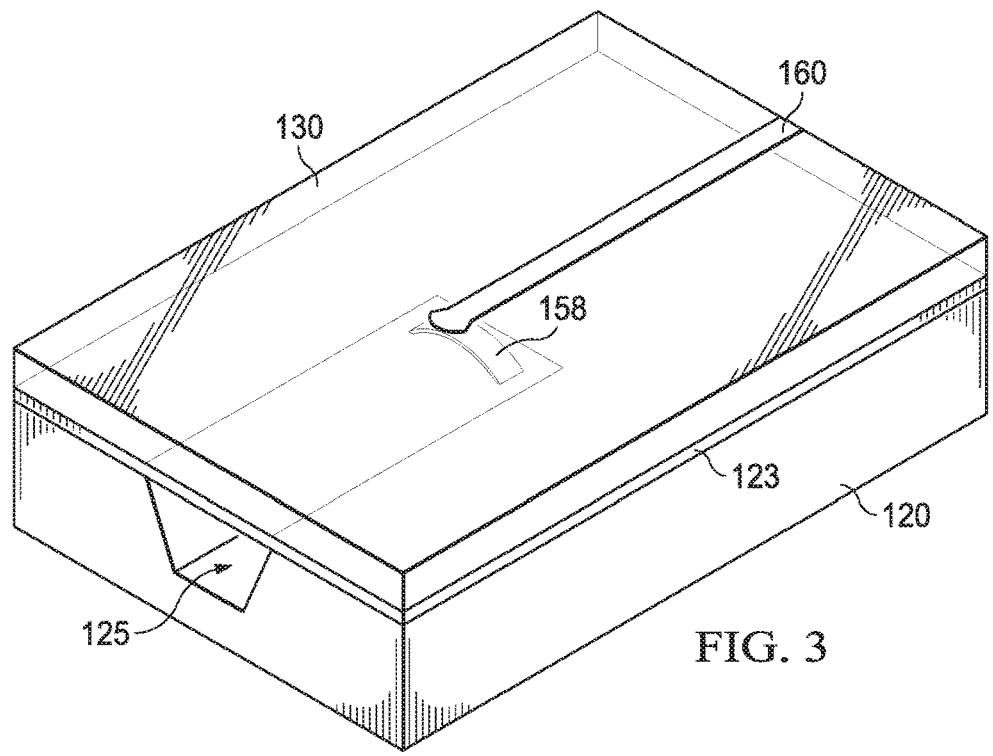
FIG. 3 shows a cross-sectional view of the hermetically sealed cavity of various embodiments.

FIG. 3 shows a cross-sectional view of a structure in accordance with the disclosed embodiments. The structure may comprise a millimeter wave chip scale atomic clock. Substrate 120 is shown bonded to non-conductive structure 30 with a hermetically sealed cavity 125 formed in the substrate 120. The iris 135 (not specifically shown in FIG. 3) permits electromagnetic energy to pass through the non-conductive structure 130 from the antenna 158 in the cavity 125. A transmission line 160 also is shown formed on the exterior surface of the non-conductive structure 130 and is used to convey a radio frequency (RF) signal to/from the cavity. Layer 123 provides a common ground plane for all RF structures external to the cavity 125. In addition, it limits propagation of waves travelling in layer 120. The dimensions of the waveguide, antenna, EBG, and size and positioning of the iris 135 are all design considerations based on the chosen molecular species inside the cavity and the wavelength of the interrogation waveform within the cavity. The required bandwidth of the structure depends upon the fabrication tolerances achievable in manufacturing.

Figure 4:
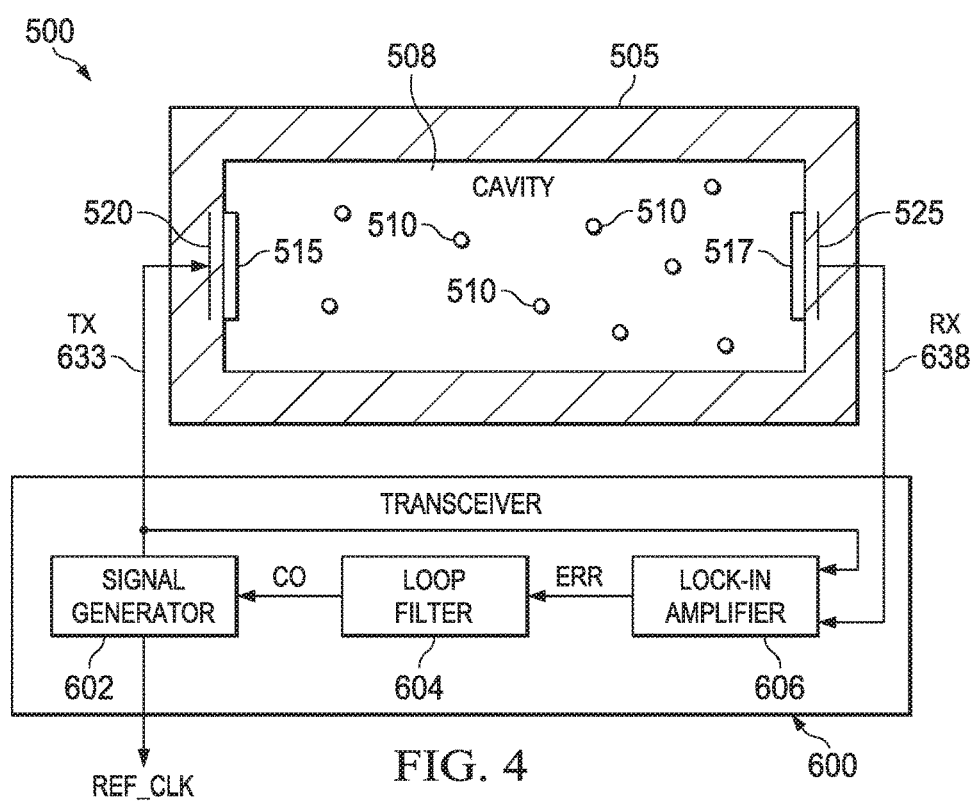
FIG. 4 shows a block diagram for a clock generator in accordance with various embodiments.

FIG. 4 shows a block diagram for a clock generator 500 in accordance with various embodiments. The clock generator 500 is a millimeter wave atomic clock that generates a reference frequency based on the frequency of quantum rotation of selected dipolar molecules contained in a hermetically sealed cavity 102 formed in semiconductor material. The reference frequency produced by quantum rotation of the selected dipolar molecules is unaffected by circuit aging and does not vary with temperature or other environmental factors.

The clock generator 500 of FIG. 4 includes a vapor cell 505 formed in this example from substrates as described above. The cell 505 includes a cavity 508 with a sealed interior enclosing a dipolar molecule material gas, for example, water ($H_2O$) or any other dipolar molecule gas at a relatively low gas pressure inside the cavity 125. Non-limiting examples of suitable electrical dipolar material gases include water, acetonitrile ($CH_3CN$) and hydrogen cyanide (HCN). As shown in FIG. 6, the clock generator 500 further includes a transceiver 600 with a transmit output 633 for providing an electrical transmit signal (TX) to the vapor cell 505, as well as a receiver input 638 for receiving an electrical input signal (RX) from the vapor cell 525. The rotational transition vapor cell 525 does not require optical interrogation, and instead operates through electromagnetic interrogation via the transmit and receive signals (TX, RX) provided by the transceiver 600.

The sealed cavity 508 includes a conductive interior cavity surface, as well as first and second non-conductive apertures 515 and 517 formed in the interior cavity surface for providing an electromagnetic field entrance and an electromagnetic field exit, respectively. In one example, the apertures 515, 517 magnetically couple into the TE10 mode of the cavity 508. In other examples, the apertures 515, 517 excite higher order modes. First and second conductive coupling structure 520 and 525 are formed on an outer surface of the vapor cell 505 proximate the first and second non-conductive aperture 515 and 517, respectively. The coupling structures 520, 525 may be the antenna(s) described above and may comprise a conductive strip formed on a surface of one of the substrates forming the cell 505. Each coupling structure 520, 525 may overlie and cross over the corresponding non-conductive aperture 515, 517 for providing an electromagnetic interface to couple a magnetic field in to (based on the transmit signal TX from the transceiver output 633) the cavity 508 or from the cavity to the transceiver RX input 638 The proximate location of the conductive coupling structures 520, 525 and the corresponding non-conductive apertures 515, 525 advantageously provides electromagnetically transmissive paths through the second or upper substrate 106, which can be any electromagnetically transmissive material.

The transceiver circuit 600 in certain implementations is implemented on or in an integrated circuit (not shown), to which the vapor cell 505 is electrically coupled for transmission of the TX signal via the output 633 and for receipt of the RX signal via the input 638. The transceiver 600 is operable when powered for providing an alternating electrical output signal TX to the first conductive coupling structure 520 for coupling an electromagnetic field to the interior of the cavity 508, as well as for receiving the alternating electrical input signal RX from the second conductive coupling structure 525 representing the electromagnetic field received from the cavity 508. The transceiver circuit 600 is operable for selectively adjusting the frequency of the electrical output signal TX in order to reduce the electrical input signal RX by interrogation to operate the clock generator 500 at a frequency which substantially maximizes the molecular absorption through rotational motor state transitions, and for providing a reference clock signal REF_CLK at the frequency of the TX output signal.

In certain examples, the transceiver 600 includes a signal generator 602 with an output 633 electrically coupled with the first conductive coupling structure 520 for providing the alternating electrical output signal TX, and for providing the reference clock signal REF_CLK at the corresponding transmit output frequency. The transceiver 600 also includes a lock-in amplifier circuit 606 with an input 638 coupled from the second conductive coupling structure 525 for receiving the RX signal. The lock-in amplifier operates to provide an error signal ERR representing a difference between the RX signal and the electrical output signal TX. In one example, the lock-in amplifier 606 provides the error signal ERR as an in-phase output, and the error signal ERR is used as an input by a loop filter 604 to provide a control output signal (CO) to the signal generator 602 for selectively adjusting the TX output signal frequency to maintain this frequency at a peak absorption frequency of the dipolar molecular gas inside the sealed interior of the cavity 508. In some examples, the RF power of the TX and RX loop is controlled so as to avoid or mitigate stark shift affects.

The electromagnetic coupling via the non-conductive apertures 520, 525 and corresponding conductive coupling structures 515, 517 facilitates electromagnetic interrogation of the dipolar gas within the cell cavity 508. In one non-limiting form of operation, the clock generator 500 operates with the signal generator 602 transmitting alternating current (AC) TX signals at full transmission power at various frequencies within a defined band around a suspected quantum absorption frequency at which the transmission efficiency of the vapor cell 505 is minimal (absorption is maximal). For example, the quantum absorption frequency associated with the dipolar water molecule is 183.31 GHz. When the system operates at the quantum frequency, a null or minima is detected at the receiver via the lock-in amplifier 606, which provides the error signal ERR to the loop filter 604 for regulation of the TX output signal frequency via the control output CO signal provided to the signal generator 602. The rotational quantum frequency of the dipolar molecule gas in the vapor cell cavity 508 is generally stable with respect to time (does not degrade or drift over time), and is largely independent of temperature and a number of other variables.

In one embodiment, the signal generator 602 initially sweeps the transmission output frequency through a band known to include the quantum frequency of the cell 505 (e.g., transitioning upward from an initial frequency below the suspected quantum frequency, or initially transitioning downward from an initial frequency above the suspected quantum frequency, or other suitable sweeping technique or approach). The transceiver 600 monitors the received energy via the input 638 coupled with (e.g., electrically connected to) the second conductive coupling structure 525 in order to identify the transmission frequency associated with peak absorption by the gas in the cell cavity 508 (e.g., minimal reception at the receiver). Once the quantum absorption frequency is identified, the loop filter 604 moves the source signal generator transmission frequency close to that absorption frequency (e.g., 183.31 GHz), and modulates the signal at a very low frequency to regulate operation around the null or minima in the transmission efficiency representing the ratio of the received energy to the transmitted energy. The loop filter 604 provides negative feedback in a closed loop operation to maintain the signal generator 602 operating at a TX frequency corresponding to the quantum frequency of the cavity dipolar molecule gas.

In steady state operation, the lock-in amplifier 606 and the loop filter 604 maintain the transmitter frequency at the peak absorption frequency of the cell gas. In one non-limiting example, the loop filter 604 provides proportional-integral-derivative (PID) control using a derivative of the frequency error as a control factor for lock-in detection and closed loop regulation. At the bottom of the null in a transmission coefficient curve, the derivative is zero and the loop filter 604 provides the derivative back as a direct current (DC) control output signal CO to the signal generator 602. This closed loop operates to keep the signal generator transmission output frequency at the peak absorption frequency of the cell gas using lock-in differentiation based on the RX signal received from the cell 508. The REF_CLK signal from the signal generator 602 is the TX signal clock and can be provided to other circuitry such as frequency dividers and other control circuits requiring use of a clock.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device, comprising:
  a non-conductive structure having opposite first and second surfaces;
  a first metal layer on the second surface, the first metal layer having an opening that exposes a portion of the second surface;
  a substrate having a third surface and a cavity that extends from the third surface into the substrate, the cavity having an internal pressure of less than 0.15 mbars;
  a second metal layer on the third surface and on a surface of the cavity;
  at least one bonding structure attaching a portion of the first metal layer to a portion of the second metal layer; and an antenna on the first surface, so the opening is between the antenna and the cavity.

2. The device of claim 1, wherein the cavity contains dipolar molecules.

3. The device of claim 2, wherein the dipolar molecules are water molecules.

4. The device of claim 1, wherein the non-conductive structure includes at least one of glass, ceramic, or silicon.

5. The device of claim 1, wherein the substrate includes at least one of a semiconductor wafer or a ceramic.

6. The device of claim 1, wherein the non-conductive structure includes glass, and the substrate includes a semiconductor substrate.

7. The device of claim 1, wherein:
the antenna is a first antenna;
the device further comprises: an amplifier; a filter; a signal generator; and a second antenna on the first surface;
the signal generator has: a control input; and a signal generator output coupled to the first antenna;
the signal generator is configured to generate and adjust a frequency of a transmit signal at the signal generator output, based on a control signal at the control input;
the amplifier has: a first input coupled to the second antenna; a second input coupled to the signal generator output; and an amplifier output;
the amplifier is configured to generate an error signal at the amplifier output, based on: a receive signal from the second antenna; and the transmit signal from the signal generator; and
the filter has: a filter input coupled to the amplifier output; and a filter output coupled to the control input;
the filter is configured to generate the control signal, based on the error signal.

8. The device of claim 1, wherein the at least one bonding structure hermetically seals the cavity.

9. A device, comprising:
a glass sheet having opposite first and second surfaces;
a first metal layer on the second surface, the first metal layer having an opening that exposes a portion of the second surface;
a semiconductor substrate having a third surface and a cavity that extends from the third surface into the semiconductor substrate;
a second metal layer on the third surface and on a surface of the cavity, a portion of the second metal layer attached to a portion of the first metal layer;
first and second antennas on the first surface; and
a transceiver electrically coupled to the first and second antennas, the transceiver configured to inject a transmit signal into the cavity through the first antenna, generate an error signal based on the transmit signal and a receive signal from the second antenna, and dynamically adjust a frequency of the transmit signal based on the error signal;
the cavity containing dipolar molecules and having an internal pressure of less than 0.15 mbars.

10. The device of claim 9, wherein the transceiver includes:
a signal generator having: a control input; and a signal generator output coupled to the first antenna;
the signal generator configured to generate and adjust a frequency of the transmit signal at the signal generator output, based on a control signal at the control input;
an amplifier having: a first input coupled to the second antenna; a second input coupled to the signal generator output; and an amplifier output;
the amplifier configured to generate the error signal at the amplifier output; and
a loop filter having: a filter input coupled to the amplifier output; and a filter output coupled to the control input;
the loop filter configured to generate the control signal, based on the error signal.

11. The device of claim 9, wherein the portion of the second metal layer is attached to the portion of the first metal layer by at least one bonding structure that hermetically seals the cavity.

* * * * *